United States Patent [19]

Eckert et al.

[11] Patent Number: 4,534,018
[45] Date of Patent: Aug. 6, 1985

[54] NON-VOLATILE MEMORY PROTECTION CIRCUIT WITH MICROPROCESSOR INTERACTION

[75] Inventors: Alton B. Eckert, Norwalk, Conn.; Easwaran C. N. Nambudiri, Hicksville, N.Y.

[73] Assignee: Pitney Bowes Inc., Stamford, Conn.

[21] Appl. No.: 489,971

[22] Filed: Apr. 29, 1983

[51] Int. Cl.³ .......................... G11C 11/40; G06F 1/00
[52] U.S. Cl. ..................................... 365/228; 364/900
[58] Field of Search ................ 365/189, 218, 228, 229

[56] References Cited

U.S. PATENT DOCUMENTS 4,285,050  8/1981  Muller .................................. 364/900
4,445,198  4/1984  Eckert .................................. 364/900

Primary Examiner—Joseph A. Popek
Attorney, Agent, or Firm—Joseph A. Sawyer, Jr.; William D. Soltow, Jr.; Albert W. Scribner

[57] ABSTRACT

A method and associated apparatus for controlling the erasure and writing of data in non-volatile memory during the power up, power down and normal operating cycles of an electronic postage meter is disclosed. The apparatus monitors the input power signal and provides an enable signal when the input signal reaches a first predetermined threshold. The apparatus transmits a reset signal to inhibit the generation of a write or erase signal to a microprocessor prior to the input power signal reaching a first predetermined threshold voltage. The apparatus provides the erase signal to the non-volatile memory after the input power signal reaches the first predetermined voltage. The apparatus then applies a bias voltage to a terminal of the memory to allow for the erasure of data therefrom. A warning signal is provided to the microprocessor when the input signal falls below a specified value. The output enable signal is removed when the input signals falls below a second predetermined voltage. The apparatus transmits the write signal and applies a bias voltage to the terminal to allow for writing to the memory when the write signal and enable signal are coincident. Finally, the reset signal is provided coincident with the removal of the output enable signal to inhibit the operation of any spurious write or erase signals.

15 Claims, 3 Drawing Figures

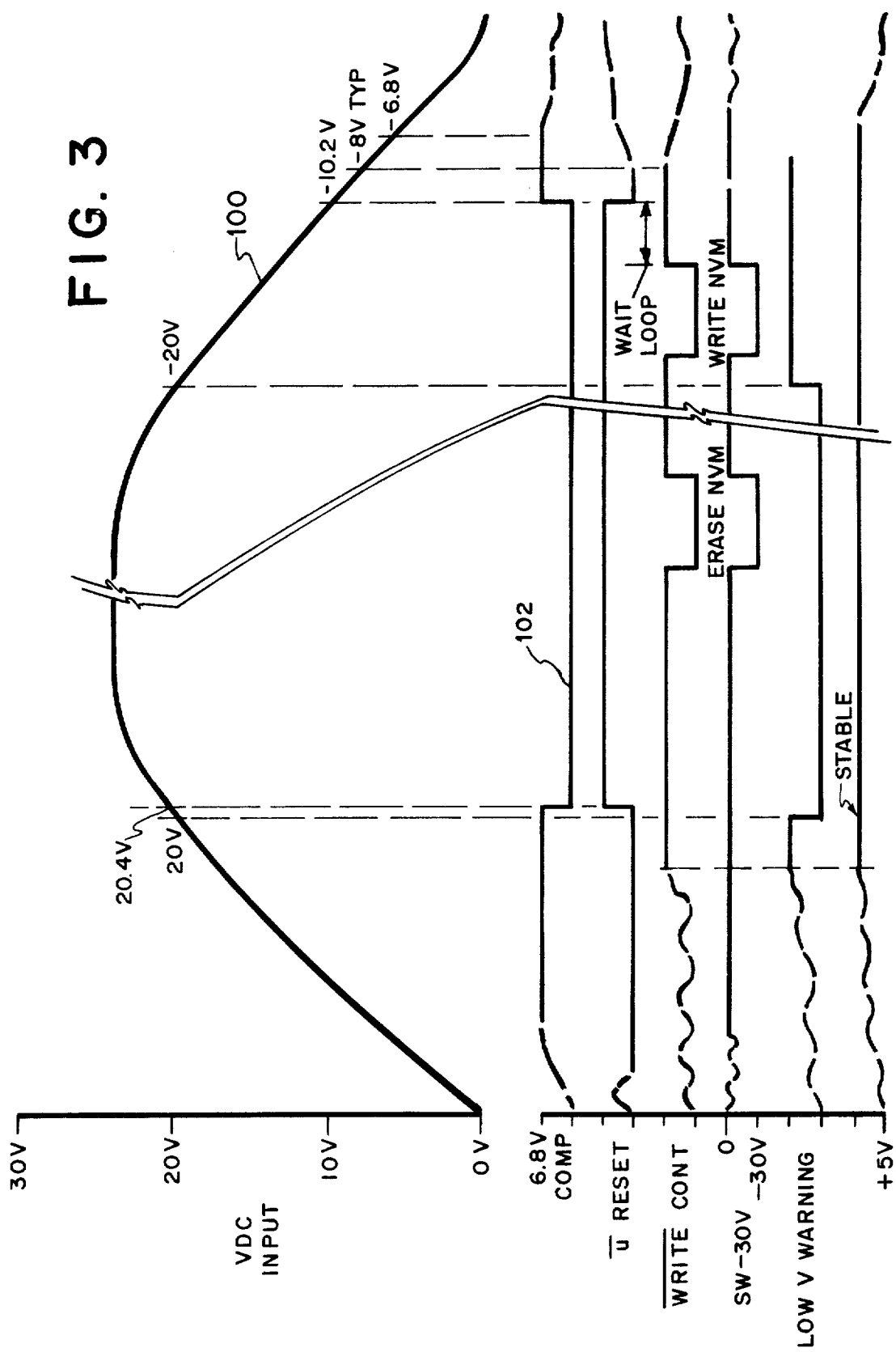

NON-VOLATILE MEMORY PROTECTION CIRCUIT WITH MICROPROCESSOR INTERACTION

CROSS-REFERENCE TO RELATED APPLICATIONS

The present application is related to copending application Ser. No. 447,815, filed on Dec. 8, 1982, in the names of Danilo Buan and Alton B. Eckert, entitled, STAND-ALONE ELECTRONIC MAILING MACHINE, which describes one type of postage meter wherein which the present invention may be utilized; the disclosure of this application in incorporated herein by reference.

BACKGROUND OF THE INVENTION

The present invention relates to electronic postage meters, and more particularly to a non-volatile memory (NVM) protection circuit with microprocessor interaction for an electronic postage meter.

Various electronic postage meter systems have been developed, as for example the systems disclosed in U.S. Pat. No. 3,978,457 for Microcomputerized Electronic Postage Meter Systems, in U.S. Pat. No. 3,938,095 for Computer Responsive Postage Meter and in European patent application, No. 80400603.9, filed May 5, 1980 for Electronic Postage Meter Having Improved Security and Fault Tolerance Features. Electronic postage meters have also been developed employing plural computing systems; such a system is shown in U.S. Pat. No. 4,301,507, for Electronic Postage Meter Having Plural Computing Systems and assigned to Pitney Bowes, Inc. of Stamford, Conn.

Electronic postage meters include non-volatile memory capability to store critical postage accounting information. This information includes, for example, the amount of postage remaining in the meter for subsequent printing or the total amount of postage already printed by the meter. Other types of accounting or operating data may also be stored in the non-volatile memory, as desired.

The non-volatile memory in electronic postage meters provides a storage function accomplished in prior mechanical type postage meters by mechanical accounting registers. However, postage meters with mechanical accounting registers are not subject to the many problems encountered by electronic postage meters. Conditions do not normally occur in mechanical type postage meters that prevent accounting for a printing cycle or which result in the loss of data stored in the mechanical accounting registers. Moreover, in mechanical postage meters it is not necessary to electronically monitor the position of the mechanical components associated with the printing of postage. This, however, is not the case with electronic postage meters.

Conditions can occur in electronic postage meters where information stored in non-volatile memory may be permanently lost. Conditions such as a total line power failure or fluctuation in voltage conditions can cause the microprocessor associated with the meter to operate erratically and either cause erasure of data or the writing of spurious data in the non-volatile memory. The erasure of data or the writing of spurious data in the non-volatile memory may result in a loss of information representing the postage funds stored in the meter. Since data of this type changes with the printing of postage and is not permanently stored elsewhere, there is no way to recapture or reconstruct the lost information. Under such circumstances, it is possible that a user may suffer a loss of postage funds.

To minimize the likelihood of a loss of information stored in the non-volatile memory, efforts have been expended to insure the high reliability of electronic postage meters. Some systems for protecting the critical information stored in the meter are disclosed in the above-noted patents and applications. An additional arrangement to protect the postage meter accounting information is disclosed in U.S. Pat. No. 4,285,050 for Electronic Postage Meter Operating Voltage Variation Sensing System, assigned to the same assignee as the present invention.

In view of the foregoing, it is desirable to provide a power supply for electronic postage meters which is physically associated with and part of the meter. In the event of an external power failure, the power supply within the secure housing of the postage meter continues to generate a sufficient, regulated power, for a long enough time to orderly and accurately transfer critical information from the volatile memory (RAM) to the non-volatile memory. The problem of insuring proper power during a power down cycle is compounded because certain non-volatile memories need several different voltages for proper operation. As an example, one type of solid state memory requires the presence of three different voltages to accomplish a write or erase operation.

While the microprocessors used in electronic postage meters can be reset and become inoperative below a predetermined voltage level, such microprocessors may become active again at even lower voltage levels. The microprocessors may be turned off below a predetermined voltage level and thereafter within a lower range turn on again and be capable of outputting data. The microprocessors will again turn off below the lower predetermined range. Because of this unreliable operation with respect to reset or turn off, the accounting information within the postage meter can be destroyed by the inadvertent erasing of data or writing of spurious data during a power down cycle when the microprocessor is believed to be inoperative. Moreover, the cost of carefully testing and selecting microprocessor component for postage meters to avoid this problem can greatly increase the cost of such parts, both because of the cost of testing and because of the rejection of the microprocessor devices that exhibit this characteristic.

Systems have been designed to preserve information stored in electronic memory units when power fails. Examples of systems of this type are shown in U.S. Pat. No. 3,859,638 for a Non-Volatile Memory Unit with Automatic Standby Power Supply; U.S. Pat. No. 4,049,951 for Data Detection Apparatus; and U.S. Pat. No. 3,676,717 for Non-Volatile Flip-Flop Memory Cell. These systems, in part, involve sensing power failure and taking measures to insure data is not lost such as by employing an auxiliary standby power supply or by loading the data into a non-volatile memory. Other United States patents which show systems to protect stored information are U.S. Pat. No. 3,801,963 for Method and Apparatus for Transferring Data from a Volatile Data Store Upon the Occurrence of a Power Failure in a Computer; U.S. Pat. No. 3,959,778 for Apparatus for Transferring Data from a Volatile Main Memory to a Store Unit Upon the Occurrence of an Electrical Supply Failure in a Data Processing System;

U.S. Pat. No. 3,810,116 for Volatile Memory Protection; and U.S. Pat. No. 3,980,935 for Volatile Memory Support System.

Power failure protection systems have been incorporated in electronic postage meter systems. A postage meter power failure protection system is shown and described in U.S. Pat. No. 3,978,457 for Microcomputerized Electronic Postage Meter System. In this system, when a voltage drops below a threshold level, a signal is generated which initiates a shut down routine. As part of the shut down routine, the contents of a working random access memory are transferred to a non-volatile memory. The maximum time to detect the shut down signal and the time to transfer the register contents from the work memory to the non-volatile memory is a function of the circuit components including the power supply filter capacitors. It is known that during "power-up" and "power-down" the microprocessor may not function predictably and, therefore, that the memory must be protected. The protection is accomplished by gates.

Pending patent application Ser. No. 306,979, filed on Sept. 29, 1981, in the name of Alton B. Eckert, entitled, MEMORY PROTECTION CIRCUIT FOR AN ELECTRONIC POSTAGE METER, provides a memory protection circuit which protects against unreliable microprocessor operation when power failure occurs for any reason. The memory protection circuit maintains the integrity of the accounting data stored in the meter by insuring that information is not inadvertently written into or erased from the non-volatile memory during a power down cycle. Further, such patent application in the name of Alton B. Eckert describes the various voltage levels necessary for writing into different types of non-volatile memories and the requirement to maintain such voltages for a long enough time during the power down cycle to provide an orderly and accurate transfer of critical information from the volatile memory (RAM) to the NVM. However, in accordance with such patent application although the NVM is protected during the power down cycle from the writing of spurious data therein, there is no such protection afforded to the NVM during normal meter operation when a fluctuation in voltage conditions may cause the microprocessor to operate erratically, causing the erasure of data or the writing of spurious data in the non-volatile memory.

In accordance with such patent application of Alton B. Eckert bias voltages are maintained on the non-volatile memory for sufficient time during the power down cycle to provide an orderly and accurate transfer of critical information from the RAM to the NVM if the power supplied has reached its expected output voltage. However, should a power failure occur during power up shortly after the write terminal of the NVM is energized, it is possible that critical information may be lost since the write terminal voltage is removed at the same point on the power supply output voltage curve during the power down cycle as it is applied to the write terminal during power up.

In the aforementioned U.S. Pat. No. 4,285,050 an operating voltage variation sensing system is disclosed for an electronic postage meter using hysteresis for the power down and power up cycles. Although such circuit provides control of the application of an enable voltage to the non-volatile memory during power up and power down of the meter, it is relatively complex and expensive to implement. Further, such circuit utilizes the architecture of the microprocessor to provide the power down cycle threshold voltage, whereas the present invention provides a low voltage warning signal and power down cycle threshold voltage to the microprocessor external therefrom.

A circuit arrangement for protecting the non-volatile memory of an electronic postage meter to prevent inadvertent erasing of data and writing of spurious data into memory locations in the NVM during normal postage meter operation when the NVM is not being addressed is set forth in pending patent application Serial No. 485,778, filed on Apr. 18, 1983 in the name of Arno Muller, entitled, NON-VOLATILE MEMORY PROTECTION CIRCUIT FOR AN ELECTRONIC POSTAGE METER. See also pending patent application Ser. No. 397,395, filed on July 12, 1982, in the name of T. Germaine et al., entitled, SECURITY SYSTEM FOR USE WITH ELECTRONIC POSTAGE METER TO PREVENT BLOCK ERASURE OF DATA, which discloses circuits for preventing the block erase of data from non-volatile memory during meter operation.

SUMMARY OF THE INVENTION

It is an object of the present invention to provide a non-volatile memory protection circuit which protects the NVM during power-up and power-down of an electronic postage meter, as well as during normal meter operation.

It is a further object of the present invention to provide a non-volatile memory protection circuit which interacts with the microprocessor during meter operation.

It is a still further object of the present invention to provide a non-volatile memory protection circuit in which a low voltage warning signal and power down cycle threshold voltage are applied to the microprocessor external therefrom.

It is a still further object of the present invention to provide a non-volatile memory protection circuit which is reliable and simple in design, yet inexpensive to implement.

Briefly, in accordance with the present invention, a method and associated apparatus is provided for controlling the erasure and writing of data in non-volatile memory during the power up, power down and normal operating cycles of an electronic postage meter, comprising the steps of monitoring an input power signal to provide an output enable signal when the input power signal reaches a first predetermined threshold voltage, transmitting a reset signal to a microprocessor to inhibit the generation of a write or erase signal prior to the input power signal reaching the threshold voltage, transmitting a erase signal to the non-volatile memory from the microprocessor subsequent to the input power signal reaching the threshold voltage, applying a bias voltage to a terminal of the non-volatile memory to allow the erasure of data therefrom only during a coincidence between the erase signal and the output enable signal, providing a low voltage warning signal to the microprocessor when the input power signal falls below the first predetermined threshold voltage, removing the output enable signal when the input power signal falls below a second predetermined threshold voltage, transmitting the write signal from the microprocessor subsequent to receiving the low voltage warning signal and prior to removal of the output enable signal, applying a bias voltage to the terminal of the non-volatile memory to allow the writing of data therein only during a coincidence between the non-volatile memory write signal and the output enable signal, and providing the reset signal to the microprocessor coincident with the removal of the output enable signal to inhibit the generation of any spurious write or erase signals by the microprocessor during the remainder of the power down cycle.

Other objects, aspects and advantages of the present invention will be apparent to those skilled in the art from the detailed description considered in conjunction with the drawings as follows:

BRIEF DESCRIPTION OF THE DRAWINGS

FIG. 3 is a graph of the D.C. input voltage and the voltage signals which occur during application of the D.C. input voltage.

DETAILED DESCRIPTION

Figure 1:
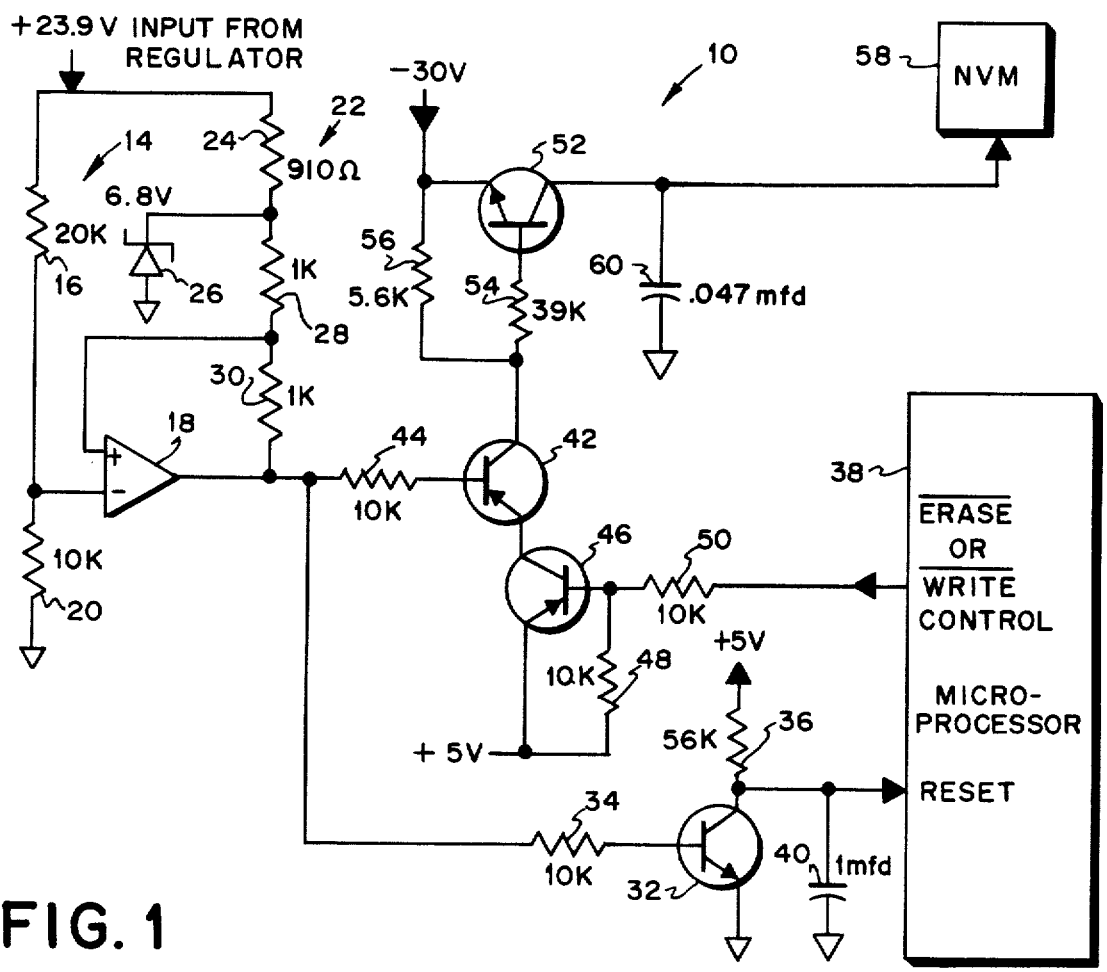
FIG. 1 is a circuit diagram of a portion of the non-volatile memory protection circuit.

Referring to FIG. 1, the non-volatile memory protection circuit is illustrated at 10. This circuit 10 includes a comparator generally designated as 12 which receives a +23.9 V input from a 24 V regulator, see FIG. 2. The comparator 12 includes a first voltage divider 14 having a first resistor 16 electrically coupled between the +23.9 V input and the negative terminal of an operational amplifier 18, and a second resistor 20 connected between the negative terminal of the operational amplifier 18 and ground.

A second voltage divider 22 includes a resistor 24 coupled between the +23.9 V input and one terminal of a Zener diode 26. The Zener diode 26 has a breakdown voltage of 6.8 V and its other terminal is grounded. A second resistor 28 is coupled between the resistor 24 and the positive terminal of the operational amplifier 18. Finally, a third resistor 30 is coupled between the resistor 28 and the output of the operational amplifier 18. The resistors 28 and 30 being electrically connected at a reference point designated 31.

The output of the operational amplifier 18 is coupled to the base terminal of an NPN transistor 32 through a current limiting resistor 34. The emitter terminal is grounded and the collector terminal is coupled to a +5 V bias through a current limiting resistor 36. The output from the collector terminal is applied to a RESET terminal of a microprocessor 38. Also coupled between the collector terminal and ground is a timing capacitor 40.

Also coupled to the output of the operational amplifier 18 is a PNP transistor 42. The base terminal of the transistor 42 is coupled to the output of the operational amplifier 18 through a current limiting resistor 44. The emitter terminal of the transistor 42 is coupled to the collector terminal of a PNP transistor 46. The emitter of the transistor 46 is coupled to a +5 V bias. A resistor 48 is coupled between the emitter and base terminals. The base terminal of the transistor 46 is coupled to an ERASE or WRITE terminal of the microprocessor 38 through a current limiting resistor 50.

The collector terminal of the transistor 42 is coupled to the base of an NPN transistor 52 through a current limiting resistor 54. The emitter terminal of the transistor 52 is coupled to a negative voltage supply, here −30 V, and a biasing resistor 56 is coupled between the emitter terminal of a transistor 52 and the collector terminal of transistor 42. The collector terminal of transistor 52 is coupled to the NVM 58. Also coupled between the collector terminal of the transistor 52 and ground is a filtering capacitor 60.

Figure 2:
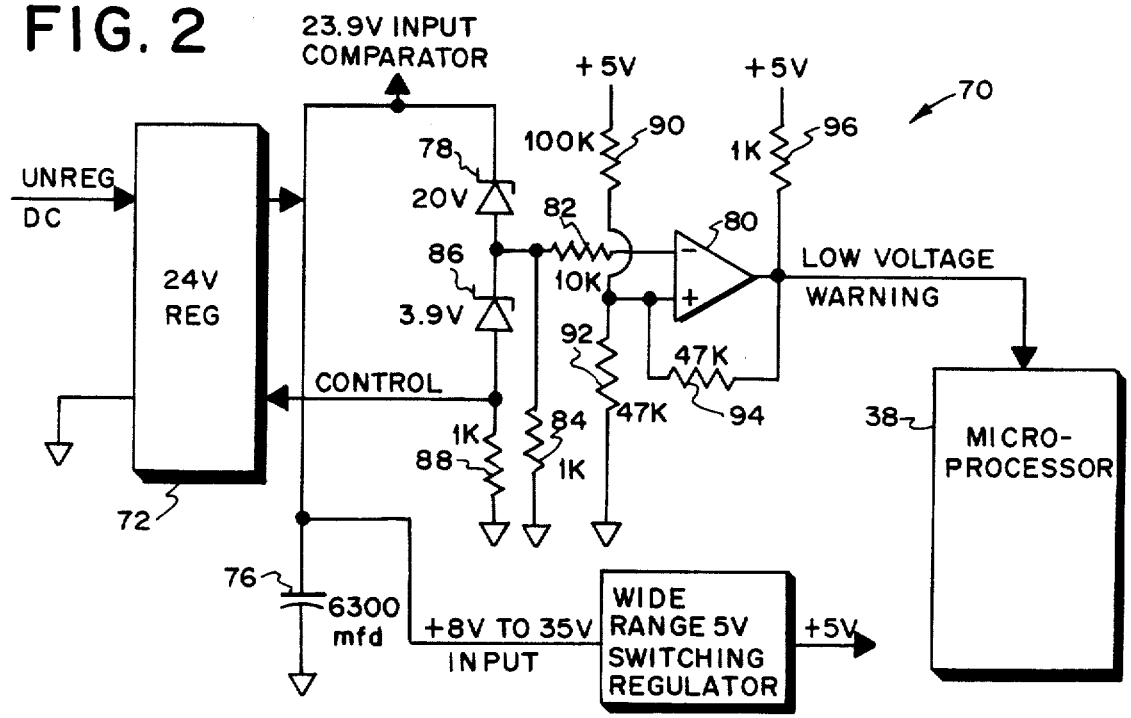
FIG. 2 is a circuit diagram of the low voltage warning circuitry of the non-volatile memory protection circuit.

Referring to FIG. 2, a low voltage warning circuit is illustrated generally at 70. Initially, unregulated D.C. is supplied to a 24 V regulator 72 for regulation. The output of the 24 V regulator 72 is applied to a +5 V wide range switching regulator 74, such as a SH1605 available from National Semiconductor Corporation, for providing a constant +5 V output when the input voltage is within the range of +8 to +35 V. An energy storage capacitor 76 is coupled between the output of the +24 V regulator 72 and ground.

The output of the +24 V regulator 72 is coupled to the N terminal of a Zener diode 78 having a breakdown voltage of 20 V. The P terminal of the Zener diode 78 is coupled to the negative terminal of an operational amplifier 80 through a current limiting resistor 82. Another resistor 84 also couples the P terminal of the Zener diode 78 to ground. Another Zener diode 86 having a breakdown voltage of 3.9 V has its N terminal coupled to the P terminal of Zener diode 78 and its P terminal coupled to the +24 V regulator 72 to provide feedback control of the output voltage from the regulator 72. A resistor 88 also couples the P terminal of the Zener diode 86 to ground.

The positive terminal of the operational amplifier 80 has a +5 V bias applied thereto through a current limiting resistor 90. A resistor 92 is also coupled between the positive terminal of the operational amplifier 80 and ground.

A feedback resistor 94 is coupled between the output of the the operational amplifier 80 and its positive input terminal. The output of the operational amplifier 80 is coupled to the low voltage warning terminal of the microprocessor 38. The output of the amplifier 80 is normally held at +5 volts through a +5 V bias voltage applied thereto through a current limiting resistor 96.

Referring to FIG. 3, the D.C. input voltage curve designated 100 is shown with the pertinent voltage signals during power up, power down and normal meter operation related thereto.

Specifically, during power up, and with reference also to FIGS. 1 and 2, the output of the comparator 12 is in its high state as the input voltage rises toward 6.8 V. At this point, the Zener diode 26 conducts and holds the output of the operational amplifier 18 at a constant 6.8 V. When a high output is present at the output of the operational amplifier 18, the transistor 32 conducts providing a $\overline{\text{RESET}}$ signal (true low) to the microprocessor 38. The presence of the $\overline{\text{RESET}}$ signal inhibits the microprocessor 38 from generating an $\overline{\text{ERASE}}$ or $\overline{\text{WRITE}}$ signal until the $\overline{\text{RESET}}$ signal is removed. Further, during this period the transistors 46 and 42 are biased out of conduction so that the transistor 52 does not conduct. Therefore, there is no output applied to the −30 V terminal of the NVM 58. This condition is true from the time the comparator 12 becomes operational (about 2–3 volts) until the input voltage reaches +20.4 volts.

However, when the input voltage reaches 20.4 V, the output voltage of the operational amplifier 18 abruptly switches to zero as seen in FIG. 3. This is caused by the voltage divider 14 which due to the arrangement of resistors 16 and 20 supplies ⅓ of the input voltage or 6.8 volts to the negative terminal of the operational amplifier 18. Since the positive terminal is also held at 6.8 volts, the operational amplifier 18 switches to a zero volt output. The output of the operational amplifier 18 then remains at zero during the remainder of the power-up cycle and during normal meter operation since the voltage present at the negative input terminal of the operational amplifier 18 is greater than the voltage present at the positive input terminal. The presence of a zero voltage at the output of the operational amplifier 18 turns off transistor 32 allowing the microprocessor 38 to come out of the reset condition after a short delay provided by timing capacitor 40.

Also, during power up, a low voltage warning signal is supplied to the microprocessor 38 by operational amplifier 80 until the input voltage exceeds 20 volts and Zener diode 78 conducts. The switching regulator 74 supplies a positive bias to the positive input of the operational amplifier 80 resulting in a high or warning signal. As the input voltage exceeds 20 volts, Zener diode 78 starts to conduct causing the output of comparator 80 to go low. The microprocessor 38 coming out of the reset condition, loops under program control until the output of the operational amplifier 80 goes low indicating the conclusion of a successful power up sequence.

During power up, after the input voltage has surpassed the threshold voltage of 20.4 V, the microprocessor 38 under program control applies an $\overline{\text{ERASE}}$ control signal (true low) to the base terminal of transistor 46. This causes the transistor 46 to conduct providing a positive output voltage at its collector terminal. The presence of the positive output voltage at the collector terminal of the transistor 46 biases the transistor 42 into conduction since its base terminal is held at 0 volts. Thus, a positive voltage appears at the base terminal of transistor 52. Since −30 V is present at the emitter terminal, the transistor 52 conducts supplying −30 V to the WRITE terminal of the NVM 58 for erasing data therefrom, see FIG. 3.

During power down, as the input voltage decreases a low voltage warning signal appears at the output of the differential amplifier 80 when the voltage decreases to 20 V. At this point, the Zener diode 78 no longer conducts. Since the positive terminal of the operational amplifier 80 is pulled toward +5 V, a high output appears at the output of the operation amplifier 80, thereby warning the microprocessor 38 that the voltage is decreasing. At nominally +8 V output from the regulator 72, the wide range switching regulator 74 no longer supplies a +5 V output. Therefore, the low voltage warning voltage output decays below +8 V. However, prior to reaching nominally +8 V, but after the D.C. input voltage has fallen below +20 V, the microprocessor 38 provides a $\overline{\text{WRITE}}$ control signal to the transistor 46 resulting in the application of −30 V to the WRITE terminal of the NVM 58 due to conduction by the transistor 52. Thus, data is written into the NVM 38, e.g., from a RAM (not shown).

When the D.C. voltage level falls to another threshold voltage, here 10.2 V, the output of the comparator 12 abruptly switches to 6.8 V since the voltage on divider 14 falls below the 3.4 volt reference of divider 22. This precludes conduction by the transistors 42 and 52 and thus prevents the application of −30 V to the NVM 58. Similar to power up, when the output of the comparator 12 rises to +6.8 V, the transistor 32 conducts applying a $\overline{\text{RESET}}$ signal to the microprocessor 38 which inhibits the generation of an ERASE signal from the microprocessor 38 until after the $\overline{\text{RESET}}$ signal is absent which occurs when the output of the comparator 12 is zero, i.e., at a D.C. input voltage of 20.4 V, during power down, when the output of the comparator again rises to +6.8 V, i.e., at a D.C. input voltage of 10.2 V, the transistor 32 conducts applying a $\overline{\text{RESET}}$ signal to the microprocessor 38 which further inhibits the generation of a WRITE signal from the microprocessor 38 until a power up cycle is entered.

During the normal operating cycle of the meter, i.e., after the input voltage has stablized at +24 V, the $\overline{\text{RESET}}$ signal is high so that the microprocessor 38 can generate a $\overline{\text{WRITE}}$ or $\overline{\text{ERASE}}$ signal as required for the NVM 58. Additionally, the zero volt enabling signal 102 in FIG. 3 is present at the output of the operational amplifier 18. Thus, a $\overline{\text{WRITE}}$ or $\overline{\text{ERASE}}$ signal from the microprocessor 38 will cause the transistors 46 and 42 to conduct. Conduction of transistor 42 causes transitor 52 to conduct. This results in the application of −30 V to the NVM 58, enabling the same for the writing of data therein or erasure of data therefrom. Some instances in which it may be desired to erase or write data in NVM during normal meter operation include recharging the registers, e.g., the ascending registers in NVM, changing the combination in VRMRS meters, operating the meter in the service mode to interrogate and change parameters in the NVM, and storing a fault in the NVM.

It is known and should be understood for the purpose of the present application that the term postage meter referes to the general class of devices for the imprinting of a defined unit value for governmental or private carrier delivery of parcels, envelopes, or other like application for unit value printing. Thus, although the term postage meter is utilized, it is both known and employed in the trade as a general term for devices utilized in conjunction with services other than those exclusively employed by governmental postage and tax services. For example, private, parcel and freight services purchase and employ such meters as a means to provide unit value printing and accounting for individual parcels.

It should be apparent to those skilled in the art that various modifications may be made in the present invention without departing from the spirit and scope thereof as described in the specification and defined in the appended claims.

What is claimed is:

1. A method for controlling the erasure and writing of data in non-volatile memory of an electronic postage meter, comprising the steps of:
    monitoring an input power signal to provide an output enable signal when the input power signal reaches a first predetermined threshold voltage;
    transmitting a reset signal to a microprocessor to inhibit the generation of an erase or a write signal prior to the input power signal reaching the threshold voltage;
    transmitting the erase signal to the non-volatile memory from the microprocessor subsequent to the input power signal reaching the first threshold voltage;
    applying a bias voltage to a terminal of the non-volatile memory to allow the erasure of data therefrom only during a coincidence between the erase signal and the output enable signal;
    providing a low voltage warning signal to the microprocessor when the input power signal falls below a specified value;

removing the output enable signal when the input power signal falls below a second predetermined threshold voltage;

transmitting the write signal from the microprocessor subsequent to receiving the low voltage warning signal and prior to removal of the output enable signal;

applying a bias voltage to the terminal of the non-volatile memory to allow the writing of data therein only during a coincidence between the non-volatile memory write signal and the output enable signal; and providing the reset signal to the microprocessor coincident with the removal of the output enable signal to inhibit the generation of any spurious write or erase signals by the microprocessor.

2. The method recited in claim 1, including the step of setting the first predetermined voltage at a higher magnitude than the second predetermined threshold voltage.

3. The method recited in claim 1, including the step of:

providing a stable input voltage to the microprocessor during normal meter operation between the first and second predetermined threshold voltages.

4. Apparatus for controlling the erasure and writing of data in non-volatile memory of a microprocessor controlled electronic postage meter, comprising:

comparator means with an output terminal for providing output voltages in response to an input voltage signal;

reset signal means electrically coupling the output terminal of said comparator means to the microprocessor which inhibits the generation of erase and write signals in the absence of a predetermined control output voltage at the output of said comparator means;

erase and write control means electrically coupled between a control terminal of the microprocessor and the output terminal of said comparator means;

non-volatile memory switching means electrically coupled to said erase and write control means for supplying an enabling voltage to the non-volatile memory when said non-volatile memory switching means is activated in response to the presence of a control signal from the control terminal of the microprocessor and the presence of the predetermined control output voltage at the output of said comparator means;

said comparator means providing the predetermined control output voltage at its output terminal at a first specified voltage level during a power up cycle and removing the predetermined control output voltage from its output terminal at a second specified voltage level during a power down cycle, the first specified voltage level being greater than the second specified voltage level.

5. The apparatus recited in claim 4, including:

low voltage warning means for providing a low voltage warning signal to the microprocessor during the power down cycle when the input voltage has decreased to a preset voltage level.

6. The apparatus recited in claim 4, wherein:

said comparator means includes an operational amplifier, a Zener diode and voltage divider network, said Zener diode and voltage divider network establishing the value of the predetermined control output voltage.

7. The apparatus recited in claim 4, wherein:

said reset signal means includes a transistor which is biased to conduct when the predetermined control output voltage is absent at the output terminal of said comparator means.

8. The apparatus recited in claim 4, wherein:

said erase and write control means includes a pair of interconnected transistors for receiving a control signal from the microprocessor at a first input and the output of said comparator means at a second input.

9. The apparatus recited in claim 4, wherein:

said non-volatile memory switching means includes a transistor having a bias voltage applied to a first terminal and the output of said erase and write control means applied to a second terminal, and a third terminal being connected to the non-volatile memory.

10. The apparatus recited in claim 5, wherein:

said low voltage warning means includes an operational amplifier and a pair of Zener diodes electrically coupled to said operational amplifier to provide the low voltage warning signal to the microprocessor when the input voltage to said low voltage warning means falls below the voltage breakdown value of one of said Zener diodes.

11. Apparatus for controlling the erasure and writing of data in non-volatile memory of a microprocessor controlled electronic postage meter, comprising: comparator means for providing output voltages at its output terminal in response to an input voltage signal;

reset signal means electrically coupling the output terminal of said comparator means to the microprocessor which inhibits the generation of erase and write signals in the absence of a predetermined control output voltage at the output of said comparator means;

erase and write control means electrically coupled between a control terminal of the microprocessor and the output terminal of said comparator means;

non-volatile memory switching means electrically coupled to said erase and write control means for supplying an enabling voltage to the non-volatile memory when said non-volatile memory switching means is activated in response to the presence of a control signal from the control terminal of the microprocessor and the presence of the predetermined control output voltage at the output of said comparator means;

said comparator means providing the predetermined control output voltage at its output terminal at a first specified voltage level during a power up cycle and removing the predetermined control output voltage signal from its output terminal at a second specified voltage level during a power down cycle, the first specified voltage level being greater than the second specified voltage level;

said comparator means includes an operational amplifier, a Zener diode and a voltage divider network, said Zener diode and voltage divider network establishing the value of the predetermined control voltage output;

said non-volatile memory switching means includes a transistor having a bias voltage applied to a first terminal and the output of said erase and write control means applied to a second terminal, and a third terminal being connected to the non-volatile memory.

12. The apparatus recited in claim 11, wherein:

said erase and write control means includes a pair of interconnected transistors for receiving a control signal from the microprocessor at a first input and the output of said comparator means at a second input.

13. The apparatus recited in claim 11, including:

low voltage warning means for providing a low voltage warning signal to the microprocessor during a power down cycle when the input voltage has decreased to a preset voltage level.

14. The apparatus recited in claim 13, wherein:

said low voltage warning means includes an operational amplifier and a pair of Zener diodes electrically coupled to said operational amplifier to provide the low voltage warning signal to the microprocessor when the input voltage to said low voltage warning means falls below the voltage breakdown value of one of said Zener diodes.

15. The apparatus recited in claim 11, wherein:

said reset signal means includes a transistor which is biased to conduct when the predetermined control output voltage is absent at the output terminal of said comparator means.

* * * * *